United States Patent [19]

Matthews et al.

[11] Patent Number: 5,928,833

[45] Date of Patent: *Jul. 27, 1999

[54] RADIATION-SENSITIVE MATERIALS

[75] Inventors: Andrew E. Matthews, Carindale, Australia; David E. Murray, Leeds, United Kingdom; Allen P. Gates, Knaresborough, United Kingdom; John R. Wade, Otley, United Kingdom; Michael J. Pratt, Ilkley, United Kingdom; William A. King, Alwoodley, United Kingdom

[73] Assignee: DuPont (U.K.) Ltd., Leeds

[ * ] Notice: This patent is subject to a terminal disclaimer.

[21] Appl. No.: 08/742,735

[22] Filed: Nov. 1, 1996

Related U.S. Application Data

[62] Division of application No. 07/883,019, May 14, 1992, Pat. No. 5,609,980.

[30] Foreign Application Priority Data

May 14, 1991 [GB] United Kingdom .................... 9110418

[51] Int. Cl.$^6$ .............................. G03C 1/72; G03F 7/021; G03F 7/023; G03F 7/033
[52] U.S. Cl. ......................... 430/138; 430/157; 430/160; 430/162; 430/166; 430/175; 430/176; 430/189; 430/271.1; 430/273.1; 430/910
[58] Field of Search ...................... 430/138, 166, 430/176, 175, 271.1, 160, 157, 158, 162, 273.1, 910, 189

[56] References Cited

U.S. PATENT DOCUMENTS

| 4,956,252 | 9/1990 | Fryd et al. ............................. | 430/138 |
| 5,143,813 | 9/1992 | Joerg ....................................... | 430/162 |
| 5,609,980 | 3/1997 | Matthews et al. ..................... | 430/138 |

*Primary Examiner*—John S. Chu
*Attorney, Agent, or Firm*—Bromberg & Sunstein LLP

[57] ABSTRACT

A radiation sensitive material comprises particles including a water-insoluble heat-softenable core surrounded by a shell which is soluble or swellable in aqueous medium. The material also includes a radiation sensitive component which, on exposure to radiation, causes the solubility characteristics of the material to change. The material may be positive- or negative-working and may be coated onto a substrate from aqueous media to form a radiation sensitive plate which, after image-wise exposure, can be developed in aqueous media and then heated to cause the particles to coalesce and form a durable printing image.

16 Claims, No Drawings

RADIATION-SENSITIVE MATERIALS

This application is a divisional of application Ser. No. 07/883,019 filed on May 14, 1992, U.S. Pat. No. 5,609,980, which is hereby incorporated herein by reference.

This invention relates to radiation-sensitive materials and is concerned with such materials for use in the production of radiation-sensitive plates for, for example, the manufacture of printing plates such as lithographic or flexographic printing plates.

It has long been the aim of printing plate technology to provide printing plates giving high quality prints over long print runs whilst, in addition, having associated technology which is neither environmentally hazardous nor economically disadvantageous.

There have been many examples in the prior art of printing plate systems which have satisfied one or more of these criteria, but which have had attendant disadvantages in other areas. For example, several types of negative-working radiation-sensitive plates are known which result in printing plates having very long print runs but which require processing using hazardous solvent developers. Further, positive-working radiation-sensitive plates are invariably processed in highly corrosive, strongly alkaline developers. In both cases, application of the radiation-sensitive composition to the substrate to form the radiation-sensitive plate involves the use of hazardous and often flammable solvent-based coating solutions.

It is an object of the present invention to provide positive- or negative-working radiation sensitive plates capable of producing high quality prints from very long print runs whilst eliminating the described environmental hazards. This is achieved by using a radiation-sensitive material which is capable of application to the substrate from a substantially aqueous solution to form a radiation-sensitive plate which, after exposure, is capable of being developed with a substantially neutral aqueous developer and which, after development, can be baked to produce a very tough printing image which enables image quality to be maintained during extended print runs. Thus, the present invention enables radiation-sensitive plates to be produced using substantially aqueous coating methods and to be developed by substantially aqueous development and to be capable of producing printing images having oleophilicity, toughness, durability and resilience which are vastly superior to prior art aqueously coated plates and equivalent to prior art solvent coated negative-working plates.

According to one aspect of the present invention there is provided a radiation-sensitive material including core-shell particles comprising a water-insoluble, heat-softenable core component (A) and a shell component (B) which is soluble or swellable in aqueous medium, the material including a radiation-sensitive component (C) which, on exposure to radiation, changes the solubility characteristics of the material.

The core-shell particles contain distinct domains of components (A) and (B). The domains are arranged so that component (A) (the core) is encapsulated by component (B) (the shell) with the core and shell being linked to each other by strong physical adsorption or, more preferably, by chemical bonding. Under ambient conditions, both components are preferably solid and immobile. As a generality, core-shell particles are known and methods for preparing the same are described in U.S. Pat. No. 4,868,016 and in British Patent Specifications No.887357 and No.1107249 (Example 22).

The component (A) is an oleophilic polymer, preferably having a minimum film forming temperature (MFT) above ambient temperature, and may be an addition polymer comprising residues derived from one or more of styrene, substituted styrenes, esters of (meth)acrylic acid, vinyl halides, (meth)acrylonitrile, vinyl esters or polyethers, or it may be a polyester, polyamide or polyurethane, or any thermally fusible oleophilic material or composition capable of forming a core-shell structure as defined above. Preferred materials are addition polymers containing 50% or more by weight of styrene or substituted styrenes.

The component (B) is preferably polymeric and contains carboxylic acid, sulphonic acid, sulphonamide, quaternary ammonium, amino or other groups imparting solubility, or at least swellability, in aqueous media i.e. in water or in aqueous alkaline or acidic solutions. Particularly suitable materials for component (B) are: i) copolymers derived from the copolymerisation of one or more ethylenically unsaturated carboxylic acids with one or more of styrene, substituted styrenes, (meth)acrylate esters, (meth)acrylonitrile or vinyl acetate; ii) dicarboxylic acid half-esters of hydroxyl group-containing polymers, such as phthalic, succinic or maleic acid half esters of a polyvinyl acetal and, in particular, of a polyvinyl butyral; and iii) alkyl or aralkyl half esters of styrene- or alkly vinyl ether-maleic anhydride copolymers, in particular alkyl half esters of styrene-maleic anhydride copolymers such as Scripset 540 (Monsanto).

The radiation-sensitive component (C) may be positive-working or negative-working. Typical components (C) are water-soluble diazo resins, water-soluble or water-dispersible photopolymers or photopolymerisable compounds or any combination of these in the case of negative-working materials and aqueous-soluble or- dispersible quinone diazide derivatives or any other suitable material in the case of positive-working materials. Examples of suitable negative-working radiation-sensitive materials are the zinc chloride salt of 4-diazodiphenylamine formaldehyde condensate; a styryl pyridinium functional poly(vinyl alcohol), for example SPP-H-13 manufactured by Toyo Gosei Kogyo Co Ltd; and a combination of a water thinnable polyester acrylate such as RCP2701 manufactured by Harcros Chemicals UK Ltd and a suitable photoinitiator, for example Quantacure QTX manufactured by International Biosynthetics Ltd. A typical positive-working material may contain, for example, a naphthoquinone diazide sulphonyl imidazole derivative.

In the "core-shell" particles used in accordance with the invention, the core is composed of component (A) and the shell is composed of component (B). Radiation-sensitive component (C) may also be present on the shell.

Component (C) is present in an amount which is effective to alter the solubility characteristics of the material on exposure to radiation. Generally, component (C) comprises from 2.0 to 80.0% by weight of the material. The weight ratio of component (A) to component (B) in the material may be, for example, from 20:1 to 1:20, and preferably is in the range of from 9:1 to 1:1, respectively.

If desired, the radiation-sensitive material may contain, for example, photosensitisers, dyes, pigments, stabilisers, and other additives typically found in such systems.

The radiation sensitive material may be present as a coating on a substrate to form a radiation sensitive plate. In the case where the particles do not contain component (C), the particles may be distributed in one or more layers of the component (C) applied to the substrate. Alternatively, the particles and component (C) may be contained in separate layers.

According to a second aspect of the present invention there is provided a method of producing a radiation sensitive plate which comprises dissolving or dispersing in a substantially aqueous medium the components of a radiation sensitive material as defined in the first aspect of the present invention, applying the resultant solution or dispersion to a substrate, and drying the substrate to obtain the desired radiation sensitive plate.

In this way, the hazards associated with the flammability and toxicity of the prior solvent-applied compositions are eliminated. Depending upon the nature of the radiation sensitive material, the component C and the core/shell particles may be applied separately or together.

In the case where the radiation sensitive plate is to be used in lithographic printing plate production, it is preferred for the substrate to be hydrophilic (or to be capable of being made so) in which case component (A) is oleophilic.

Examples of suitable substrates are paper, plastics materials, metals, laminates of metal and plastics materials, and the like. Preferably, however, the substrate is of aluminium which has been electrochemically grained and anodised.

According to a third aspect of the present invention there is provided a method of producing a printing plate which comprises image-wise exposing a radiation sensitive plate as defined in the second aspect of the invention, developing the image-wise plate exposed plate in an aqueous medium to selectively remove the more soluble areas and leave an image on the substrate constituted by the less soluble areas, and subjecting the developed plate to elevated temperature to cause the core-shell particles in the image to coalesce.

The presence of component (B) which is soluble or swellable in aqueous media allows for the complete removal of the non-image areas of the plate, after exposure, by substantially aqueous means, prior to thermal fusion of the particles contained in the image areas.

When heated to a temperature above the glass transition temperature of the core material, the core-shell particles in the image undergo a phase transition and the core becomes more mobile and able to flow. The particles are very close together in the image and thus adjacent particles flow into one another and coalesce. This process results in the formation, in the image, of a more continuous film of the material, which is substantially more resilient, more hydrophobic and ink receptive (in the case where component A is oleophilic) and more resistant to chemical attack. The chemical structures of the materials making up the particles are not, however, changed by the heating process which enables quality printed copies to be produced even after long print runs. The component (A) preferably softens at temperatures such as from 30° to 300° C., and preferably from 100° to 200° C. to allow coalescence of the particles to occur.

The radiation-sensitive plate may be exposed through a photographic positive or negative to a UV/visible light source such as a printing down frame, a projection device, or a laser (depending on the nature of the radiation-sensitive component (C) in the radiation-sensitive material). Development may be carried out in a wholly or substantially aqueous developer to effect removal of the non-image areas, and the heat treatment may be effected for from 30 seconds to 10 minutes, pref. from 1–2 minutes, preferably between 100° C., and 200° C. The coalesced image areas are solvent-resistant, alkali-resistant and highly durable to an extent only hitherto achievable with negative-working plates which require the use of solvent-based materials for both coating the substrate during production and for removal of the non-image areas at the development stage. The printing images thus obtained are of high quality and resolution and the plates exhibit no background staining when used on a lithographic printing press.

The following Examples illustrate the invention:

EXAMPLE 1

414 cm$^3$ of distilled water were placed in a 2 L flask equipped with stirrer, condenser, thermometer and N$_2$ inlet/exit. To the stirred water were added 85.8 cm$^3$ of Carboset XL37 (a carboxyl functional acrylic resin obtained as a 35% aqueous dispersion from BF Goodrich Ltd). Then 16 cm$^3$ of 25% aqueous ammonia was added. When a crystal clear solution was obtained, 150 g of styrene were added followed by 1.5 g of ammonium persulphate in 10 cm$^3$ distilled water. The mixture was maintained at 50° C. with vigorous stirring for a period of four hours to give a final product of solids content 25% w/w, with a particle size less than 0.5 microns and a monomer content of 0.05% w/w. The final product was a core-shell (CS) dispersion composed of particles comprising a core of polystyrene and a shell of the carboxylated acrylic copolymer.

EXAMPLE 2

In a 500 ml flange pot equipped with mechanical stirrer, condenser, thermometer and nitrogen inlet/exit were placed 43 ml of Carboset XL37, 200 ml of distilled water and 6 ml of 25% aqueous ammonia. When a clear solution was obtained, 0.75 g of ammonium persulphate in 20 ml of distilled water was added. The temperature was raised to 65° C. and a nitrogen blanket applied. 75 g of acrylonitrile were added over a period of one hour and the heating maintained for a further five hours.

A fine particle size dispersion was obtained after removing a small amount of coagulated material by filtration.

EXAMPLE 3

In a vessel as described in Example 2 were placed 43 ml of Carboset XL37, 200 ml of distilled water and 6 ml of 25% aqueous ammonia.

When a clear solution was obtained, 0.75 g of ammonium persulphate in 20 ml of distilled water was added. A mixture of styrene (60 g) and methyl methacrylate (15 g) was added and the reaction medium was stirred under nitrogen for six hours at 65° C.

A fine particle size dispersion was obtained.

EXAMPLE 4

A sheet of grained and anodised aluminium was coated with a 1% w/v aqueous solution of the zinc chloride salt of 4-diazodiphenylamine/formaldehyde condensate using a Meyer bar coater and was then dried at 60° C. for 1 minute. Subsequently, the CS dispersion from Example 1 was applied to the coated surface using a Meyer bar coater so as to form an over-layer, and the plate was dried at 60° C. for one minute. The total coating weight was 2.5 gm$^{-2}$. The resultant radiation sensitive plate was then image-wise exposed in a printing-down frame and developed with an aqueous solution containing 2% benzyl alcohol and an anionic surfactant. The developed plate was then placed in an oven and baked for one minute at 140° C. On removal, the printing image had become resilient, hydrophobic and very receptive to greasy ink. An exposure energy of 75 mJcm$^{-2}$ was required to give a solid step 4 on a 21-step Stouffer stepwedge. When placed on a printing press, the plate produced 90,000 satisfactory copies.

In the absence of baking, the printing image was non-hydrophobic and had poor strength and poor press performance.

EXAMPLE 5

1 g of Actocryl WB400 (a water dispersible acrylate oligomer, ex. Ancomer Ltd.) and 0.05 g Quantacure QTX (a water-soluble photoinitiator, ex. International Biosynthetics Ltd.) were dispersed in water (10 ml) and added to 20 ml of the CS dispersion of Example 1. This composition was then coated onto a grained and anodised aluminium sheet using a Meyer bar and dried at 60° C. for one minute, giving a coating weight of 2.8 $gm^{-2}$. The resultant radiation sensitive plate was exposed in a printing-down frame (300 $mJcm^{-2}$) and developed with an aqueous solution containing 2% benzyl alcohol and an anionic surfactant. The developed plate was then baked in an oven at 140° C. for one minute. The image was very hydrophobic and ink receptive and gave very many satisfactory copies on a printing press.

EXAMPLE 6

2 g of a 30% aqueous solution of poly(vinyl alcohol) acetalised with N-methyl-4-(p-formyl styryl)pyridinium methosulphate was diluted 1:1 with water and coated onto a grained and anodised aluminium sheet using a Meyer bar coater and dried at 60° C. for one minute. Subsequently, the CS dispersion of Example 1 was applied to the coated surface of the plate using a Meyer bar to form an over-layer and the plate was dried for one minute at 60° C. The total coating weight was 5 $gm^{-2}$. The resultant radiation sensitive plate was image-wise exposed (30 $mJcm^{-2}$) in a printing down frame and developed with tap water. The plate was then baked in an oven at 140° C. for one minute. A very hydrophobic and ink receptive image was obtained which showed a solid 7 stepwedge reading. The plate gave very many acceptable copies on a printing press.

EXAMPLE 7

A solution of 1.0 g 1-(naphthoquinone-1,2-diazido-5-sulphonyl)-2-hexylimidazole (as described in German Patent Specification No. 3939843) in a mixture of 1.0 g of glacial acetic acid, 3.0 g of concentrated hydrochloric acid and 50 g of water was applied to a sheet of grained and anodised aluminum using a Meyer bar coater. The coating was then dried at 60° C. for 1 minute. Subsequently, the CS dispersion from Example 1 was applied to the coated surface so as to form an over-layer, and the plate was dried at 60° C. for 1 minute. The total coating weight was 2.7 $gm^{-2}$. The resultant radiation sensitive plate was then image-wise exposed in a printing down frame (300 $mJcm^{-2}$) and developed with an aqueous solution containing sodium metasilicate and a surfactant. The plate was then baked in an oven at 140° C. for 1 minute. The image was very hydrophobic and ink receptive and gave very many satisfactory copies on a printing press.

EXAMPLE 8

Example 4 was repeated except that the CS dispersion from Example 2 was used as the over-layer. The plate was exposed, developed and heated as in Example 4 and the resultant plate, when placed on a printing press, produced 110,000 satisfactory copies.

EXAMPLE 9

Example 5 was repeated except that CS dispersion from Example 3 was used. The plate was exposed, developed and heated as in Example 5 and the resulting plate produced very many satisfactory copies when placed on a printing press.

What is claimed is:

1. A radiation-sensitive plate, the plate comprising:
    a substrate; and
    a radiation-sensitive coating thereon, the coating including:
        core-shell particles, the core-shell particles comprising an oleophilic water-insoluble, heat-softenable core component (A) having a minimum film-forming temperature above room temperature and a shell component (B) which is soluble or swellable in aqueous medium, the shell component (B) being a polymer containing carboxylic acid, sulphonic acid, sulphonamide, quaternary ammonium, or amino groups; and,
        a radiation-sensitive component (C) which, on exposure to radiation, changes the solubility characteristics of the coating, wherein the core (A) and the shell (B) components of the particles remain as separate components prior to the application of heat to the coating, but coalesce on the application of heat to the coating, and wherein the core-shell particles are distributed throughout the radiation-sensitive component (C);
    wherein the radiation-sensitive component (C) does not comprise part of the core-shell particles.

2. A radiation-sensitive plate as claimed in claim 1, wherein the core component (A) is a polymer derived from styrene, a substituted styrene, an ester of (meth)acrylic acid, a vinyl halide, (meth)acrylonitrile, a vinyl ester or polyether or a polyester resin, a polyamide or a polyurethane.

3. A radiation-sensitive plate as claimed in claim 1, wherein the radiation-sensitive component (C) is a negative-working component.

4. A radiation-sensitive plate as claimed in claim 3 wherein the negative working component is a water-soluble diazo resin or a water-soluble or water-dispersible photopolymer or photopolymerisable compound.

5. A radiation-sensitive plate as claimed in claim 4 wherein the radiation-sensitive component (C) is a zinc chloride salt of 4-diazodiphenylamine formaldehyde condensate or a styryl pyridinium functional poly(vinylalcohol).

6. A radiation-sensitive plate as claimed in claim 1, wherein the radiation-sensitive component is a positive-working component comprising an aqueous-soluble or aqueous-dispersible quinone diazide derivative.

7. A radiation-sensitive plate as claimed in claim 1, wherein the weight ratio of component (A) to component (B) in the material is from 20:1 to 1:20, respectively.

8. A radiation-sensitive plate as claimed in claim 1, wherein the film-forming temperature is from 30° to 300° C., inclusive.

9. A radiation-sensitive plate as claimed in claim 2, wherein the radiation-sensitive component (C) is a negative-working component.

10. A radiation-sensitive plate as claimed in claim 9 wherein the negative working component is a water-soluble diazo resin or a water-soluble or water-dispersible photopolymer or photopolymerisable compound.

11. A radiation-sensitive plate as claimed in claim 10 wherein the radiation-sensitive component (C) is a zinc chloride salt of 4-diazodiphenylamine formaldehyde condensate or a styryl pyridinium functional poly(vinylalcohol).

12. A radiation-sensitive plate as claimed in claim 2, wherein the radiation-sensitive component is a positive-working component comprising an aqueous-soluble or aqueous-dispersible quinone diazide derivative.

13. A radiation-sensitive plate as claimed in claim 2, wherein the weight ratio of component (A) to component (B) in the material is from 20:1 to 1:20, respectively.

14. A radiation-sensitive plate as claimed in claim 2, wherein the film-forming temperature is from 30° to 300° C., inclusive.

15. A radiation-sensitive plate as claimed in claim 11, wherein the weight ratio of component (A) to component (B) in the material is from 20:1 to 1:20, respectively.

16. A radiation-sensitive plate as claimed in claim 15, wherein the film-forming temperature is from 30° to 300° C., inclusive.

* * * * *